US009905546B2

(12) United States Patent
Tung et al.

(10) Patent No.: US 9,905,546 B2
(45) Date of Patent: Feb. 27, 2018

(54) PACKAGE ON PACKAGE STRUCTURE AND FABRICATION METHOD THEREOF

(71) Applicant: Siliconware Precision Industries Co., Ltd, Taichung (TW)

(72) Inventors: Shih-Hao Tung, Taichung (TW);
Chang-Yi Lan, Taichung (TW);
Lung-Yuan Wang, Taichung (TW);
Cheng-Chia Chiang, Taichung (TW);
Chu-Huei Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/211,244

(22) Filed: Mar. 14, 2014

(65) Prior Publication Data
US 2015/0187741 A1    Jul. 2, 2015

(30) Foreign Application Priority Data

Jan. 2, 2014    (TW) .............................. 103100022 A

(51) Int. Cl.
*H01L 21/56* (2006.01)
*H01L 23/28* (2006.01)
(Continued)

(52) U.S. Cl.
CPC ............ *H01L 25/105* (2013.01); *H01L 25/50* (2013.01); *H01L 23/3128* (2013.01);
(Continued)

(58) Field of Classification Search
None
See application file for complete search history.

(56) References Cited

U.S. PATENT DOCUMENTS

2012/0012991 A1*  1/2012  Chandrasekaran . H01L 23/3121
                                                     257/660
2012/0193789 A1*  8/2012  Hu ......................... H01L 21/56
                                                     257/738

(Continued)

*Primary Examiner* — Seahvosh Nikmanesh
*Assistant Examiner* — Xiaoming Liu
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package on package (PoP) structure is provided, which includes: providing a first packaging substrate having at least a first electronic element and a plurality of first support portions, wherein the first electronic element is electrically connected to the first packaging substrate; forming an encapsulant on the first packaging substrate for encapsulating the first electronic element and the first support portions; forming a plurality of openings in the encapsulant for exposing portions of surfaces of the first support portions; and providing a second packaging substrate having a plurality of second support portions and stacking the second packaging substrate on the first packaging substrate with the second support portions positioned in the openings of the encapsulant and bonded with the first support portions. As such, the encapsulant effectively separates the first support portions or the second support portions from one another to prevent bridging from occurring therebetween.

8 Claims, 5 Drawing Sheets

(51) Int. Cl.
- H01L 25/00 (2006.01)
- H01L 25/10 (2006.01)
- H01L 23/498 (2006.01)
- H01L 23/00 (2006.01)
- H01L 25/065 (2006.01)
- H01L 23/31 (2006.01)

(52) U.S. Cl.
CPC ... *H01L 23/49811* (2013.01); *H01L 23/49816* (2013.01); *H01L 24/13* (2013.01); *H01L 24/16* (2013.01); *H01L 24/32* (2013.01); *H01L 24/48* (2013.01); *H01L 24/73* (2013.01); *H01L 25/0657* (2013.01); *H01L 2224/131* (2013.01); *H01L 2224/16237* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/0651* (2013.01); *H01L 2225/06568* (2013.01); *H01L 2225/1023* (2013.01); *H01L 2225/1058* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 2014/0063768 A1* | 3/2014 | Tanaka | H01L 23/3121 361/784 |
| 2015/0001708 A1* | 1/2015 | Lin | H01L 25/50 257/737 |

\* cited by examiner

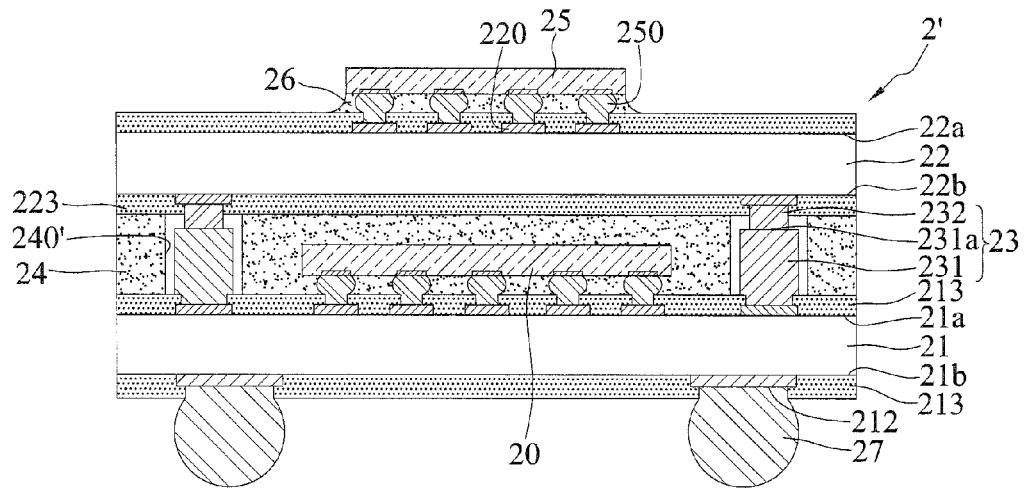
FIG.2D'
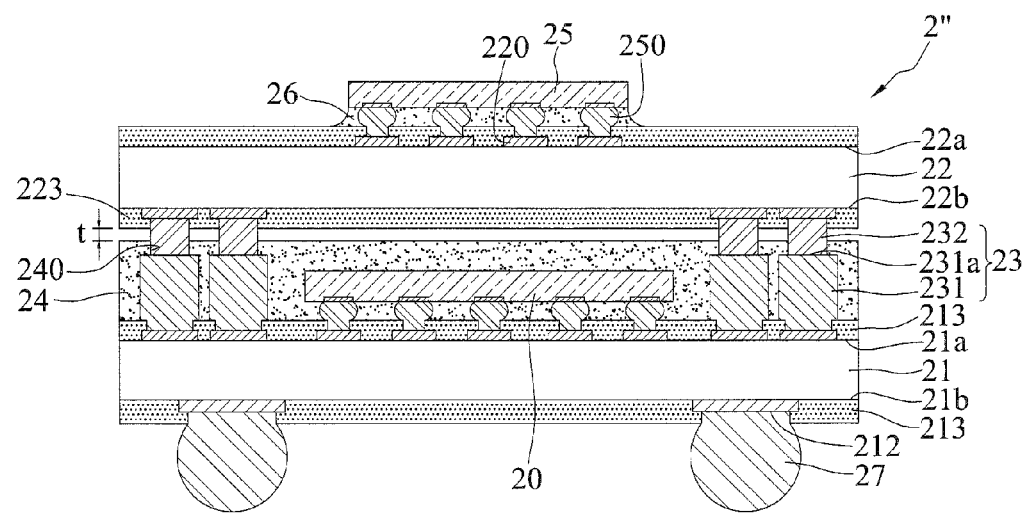
FIG.2D"

PACKAGE ON PACKAGE STRUCTURE AND FABRICATION METHOD THEREOF

CROSS-REFERENCES TO RELATED APPLICATIONS

This application claims under 35 U.S.C. § 119(a) the benefit of Taiwanese Application No. 103100022, filed Jan. 2, 2014, the entire contents of which is incorporated herein by reference.

BACKGROUND OF THE INVENTION

1. Field of the Invention

The present invention relates to package on package (PoP) structures and fabrication methods thereof, and more particularly, to a PoP structure and a fabrication method thereof for improving the product yield.

2. Description of Related Art

Along with the progress of semiconductor packaging technologies, various package types have been developed for semiconductor devices. To improve electrical performances and save spaces, a plurality of packages can be vertically stacked on one another to form a package on package (PoP) structure. Such a packaging method allows merging of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on, and therefore is applicable to various thin type electronic products.

FIG. 1 is a schematic cross-sectional view of a conventional PoP structure 1. Referring to FIG. 1, the PoP structure 1 has a first packaging substrate 11 and a second packaging substrate 12 stacked on the first packaging substrate 11. The first packaging substrate 11 has a first surface 11a and a second surface 11b opposite to the first surface 11a. A first semiconductor element 10 is disposed on the first surface 11a of the first packaging substrate 11 and electrically connected to the first packaging substrate 11, and a plurality of solder balls 17 are formed on conductive pads 112 of the second surface 11b of the first packaging substrate 11. The second packaging substrate 12 has a third surface 12a with a plurality of conductive pads 120 and a fourth surface 12b opposite to the third surface 12a. Further, a solder mask layer 123 is formed on the third and fourth surfaces 12a, 12b and has a plurality of openings for exposing the conductive pads 120.

To fabricate the PoP structure, the first semiconductor element 10 is flip-chip electrically connected to the first packaging substrate 11, an underfill 16 is formed between the first semiconductor element 10 and the first packaging substrate 11, and a plurality of solder posts 13 are formed on the first surface 11a of the first packaging substrate 11. Then, the second packaging substrate 12 is stacked on the solder posts 13 via the fourth surface 12b thereof and electrically connected to the first packaging substrate 11 through the solder posts 13. Thereafter, an encapsulant 14 is formed between the first surface 11a of the first packaging substrate 11 and the fourth surface 12b of the second package substrate 12 for encapsulating the first semiconductor element 10. Subsequently, a plurality of second semiconductor elements 15 are disposed on the third surface 12a of the packaging substrate 12 and electrically connected to the conductive pads 120, and an underfill 16 is formed between the second semiconductor element 15 and the second packaging substrate 12.

In the PoP structure 1, the solder posts 13 are used for mechanical support and electrical connection between the first packaging substrate 11 and the second packaging substrate 12. However, as I/O counts of electronic products increase, if the package size does not change, the pitch between the solder posts 13 must be reduced. As such, solder bridging easily occurs between the solder posts 13, thus reducing the product yield and reliability.

Therefore, how to overcome the above-described drawbacks has become critical.

SUMMARY OF THE INVENTION

In view of the above-described drawbacks, the present invention provides a package on package (PoP) structure, which comprises: a first packaging substrate; at least a first electronic element disposed on and electrically connected to the first packaging substrate; a plurality of first support portions formed on the first packaging substrate; an encapsulant formed on the first packaging substrate for encapsulating the first electronic element and the first support portions and having a plurality of openings for exposing portions of surfaces of the first support portions; and a second packaging substrate having a plurality of second support portions and stacked on the first packaging substrate with the second support portions positioned in the openings of the encapsulant and bonded with the first support portions.

The present invention further provides a method for fabricating a package on package (PoP) structure, which comprises the steps of: providing a first packaging substrate having at least a first electronic element and a plurality of first support portions thereon, wherein the first electronic element is electrically connected to the first packaging substrate; forming an encapsulant on the first packaging substrate for encapsulating the first electronic element and the first support portions; forming a plurality of openings in the encapsulant for exposing portions of surfaces of the first support portions; and providing a second packaging substrate having a plurality of second support portions and stacking the second packaging substrate on the first packaging substrate with the second support portions positioned in the openings of the encapsulant and bonded with the first support portions.

In the above-described structure and method, the first support portions can be electrically connected to the first packaging substrate. The first support portions can be metal posts. The first support portions can be made of copper or a solder material.

In the above-described structure and method, the first support portions can be copper bumps covered with a solder material. The copper bumps can be of a ball shape or a post shape.

In the above-described structure and method, the second support portions can be electrically connected to the second packaging substrate. The second support portions can be metal posts. The second support portions can be made of copper or a solder material.

In the above-described structure and method, the encapsulant can abut against the second packaging substrate. Alternatively, a gap can be formed between the encapsulant and the second packaging substrate.

In the above-described structure and method, at least a second electronic element can further be disposed on the second packaging substrate.

According to the present invention, an encapsulant is formed first to encapsulate the first support portions and then a plurality of openings are formed in the encapsulant for exposing portions of the surfaces of the first support portions. As such, when the second support portions are bonded with the first support portions in a subsequent process, the encapsulant effectively separates the first support portions or the second support portions from one another so as to prevent bridging from occurring therebetween, thereby improving the product yield and reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "top", "first", "second", "a" etc. are merely for illustrative purposes and should not be construed to limit the scope of the present invention.

FIGS. 2A to 2D are schematic cross-sectional views showing a method for fabricating a PoP structure 2 according to the present invention.

Figure 1:
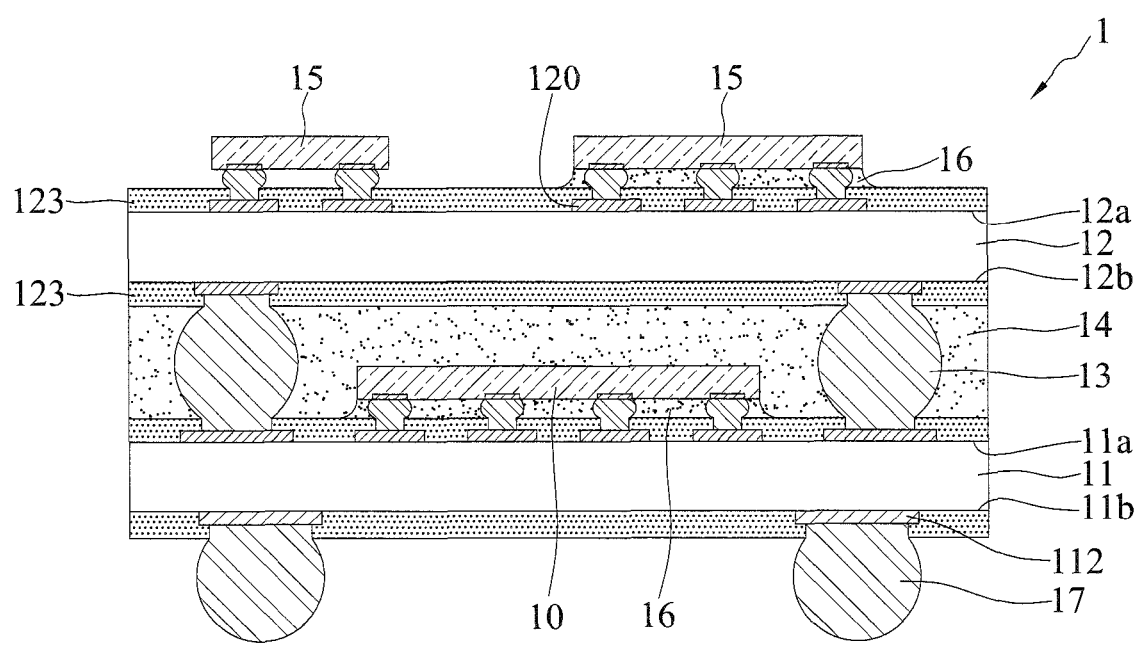
FIG. 1 is a schematic cross-sectional view of a conventional PoP structure.
Figure 2A:
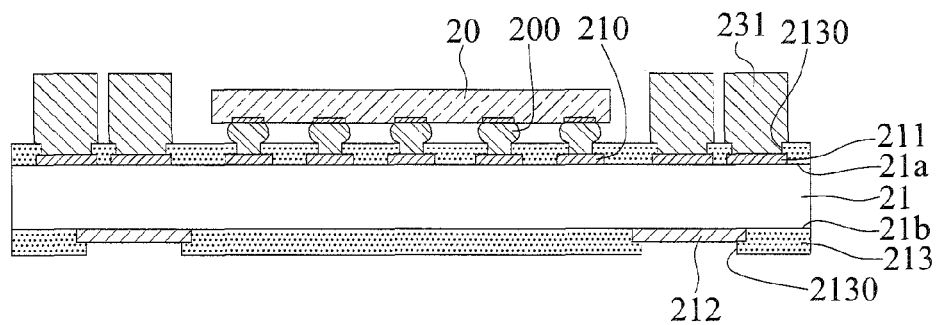
FIGS. 2A to 2D are schematic cross-sectional views showing a method for fabricating a PoP structure according to the present invention, wherein FIG. 2B' shows another embodiment of FIG. 2B, and FIGS. 2D' and 2D" show other embodiments of FIG. 2D.

Referring to FIG. 2A, a first packaging substrate 21 having a first surface 21a and a second surface 21b opposite to the first surface 21a is provided.

The first surface 21a of the first packaging substrate 21 has a plurality of first conductive pads 210 and second conductive pads 211, and the second surface 21b of the first packaging substrate 21 has a plurality of third conductive pads 212. An insulating layer 213, such as a solder mask layer, is formed on the first surface 21a and the second surface 21b of the first packaging substrate 21, and a plurality of openings 2130 are formed in the insulating layer 213 for exposing the first conductive pads 210, the second conductive pads 211 and the third conductive pads 212.

Further, a plurality of first support portions 231 are formed on and electrically connected to the second conductive pads 211. The first support portions 231 can be metal posts and made of such as copper or a solder material.

Furthermore, a first electronic element 20 is disposed on the first conductive pads 210 through a plurality of solder bumps 200. That is, the first electronic element 20 is flip-chip electrically connected to the first packaging substrate 21.

The first electronic element 20 can be an active element or a passive element. In an embodiment, a plurality of first electronic elements 20 are provided, which are active elements, passive elements or a combination thereof. The active elements are, for example, chips. The passive elements are, for example, resistors, capacitors and inductors.

Figure 2B:
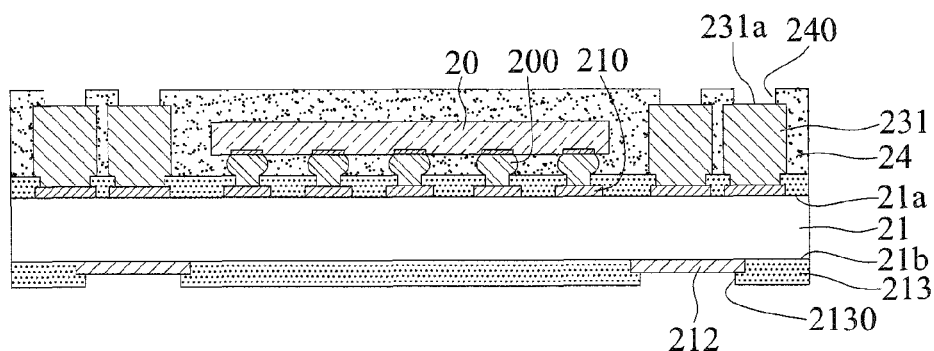
Figure 2B:
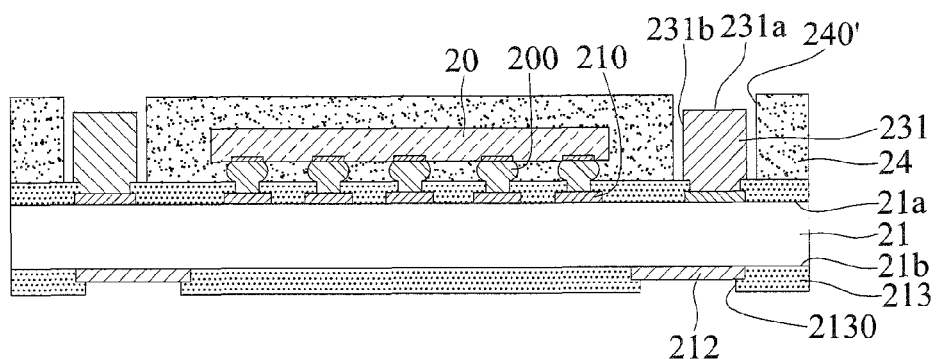

Referring to FIG. 2B, an encapsulant 24 is formed on the first surface 21a of the first packaging substrate 21 for encapsulating the first electronic element 20 and the first support portions 231. Then, a plurality of openings 240 are formed in the encapsulant 24 for exposing portions of top surfaces 231a of the first support portions 231. In the present embodiment, the openings 240 of the encapsulant 24 are formed by laser.

In another embodiment, referring to FIG. 2B', both the top surfaces 231a and side surfaces 231b of the first support portions 231 are exposed from the openings 240'.

Further, the encapsulant 24 is filled between the first electronic element 20 and the first surface 21a of the first packaging substrate 21. Alternatively, an underfill can be formed between the first electronic element 20 and the first surface 21a of the first packaging substrate 21.

Figure 2C:
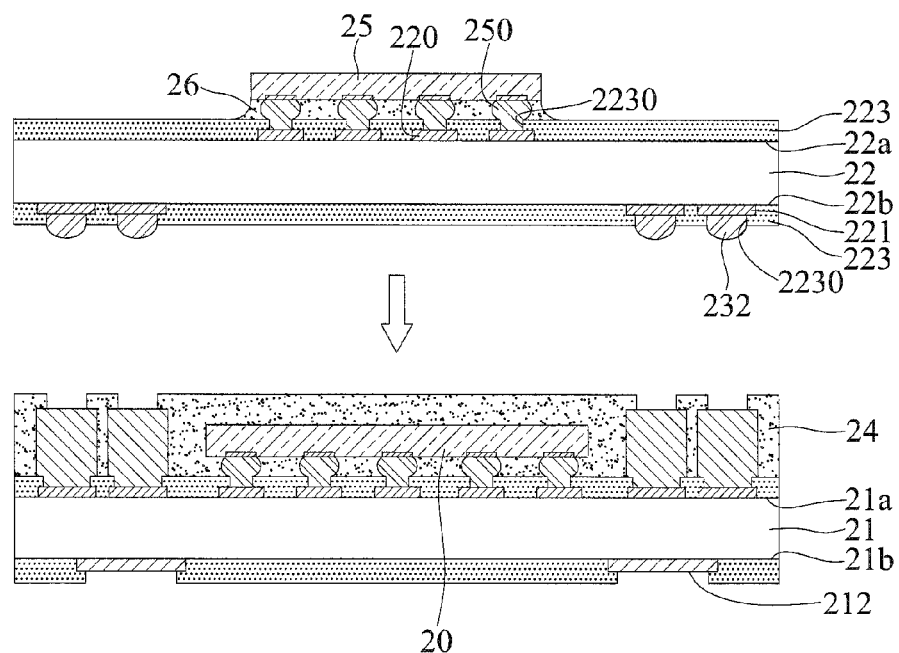

Referring to FIG. 2C, continued from FIG. 2B, a second packaging substrate 22 having a third surface 22a and a fourth surface 22b opposite to the third surface 22a is provided.

The third surface 22a of the second packaging substrate 22 has a plurality of fourth conductive pads 220 and the fourth surface 22b of the second packaging substrate 22 has a plurality of fifth conductive pads 221. An insulating layer 223, such as a solder mask layer, is formed on the third surface 22a and the fourth surface 22b, and a plurality of openings 2230 are formed in the insulating layer 223 for exposing the fourth conductive pads 220 and the fifth conductive pads 221.

Further, a plurality of second support portions 232 are formed on and electrically connected to the fifth conductive pads 221. The second support portions 232 can be metal posts and made of copper or a solder material.

Furthermore, a second electronic element 25 is disposed on the third surface 22a of the second packaging substrate 22 and flip-chip electrically connected to the fourth conductive pads 220 through, for example, a plurality of solder bumps 250. An underfill 26 is further formed between the second electronic element 25 and the third surface 22a of the second packaging substrate 22.

The second electronic element 25 can be an active element or a passive element. In an embodiment, a plurality of second electronic elements 25 are provided, which are active elements, passive elements or a combination thereof. The active elements are, for example, chips. The passive elements are, for example, resistors, capacitors and inductors.

Figure 2D:
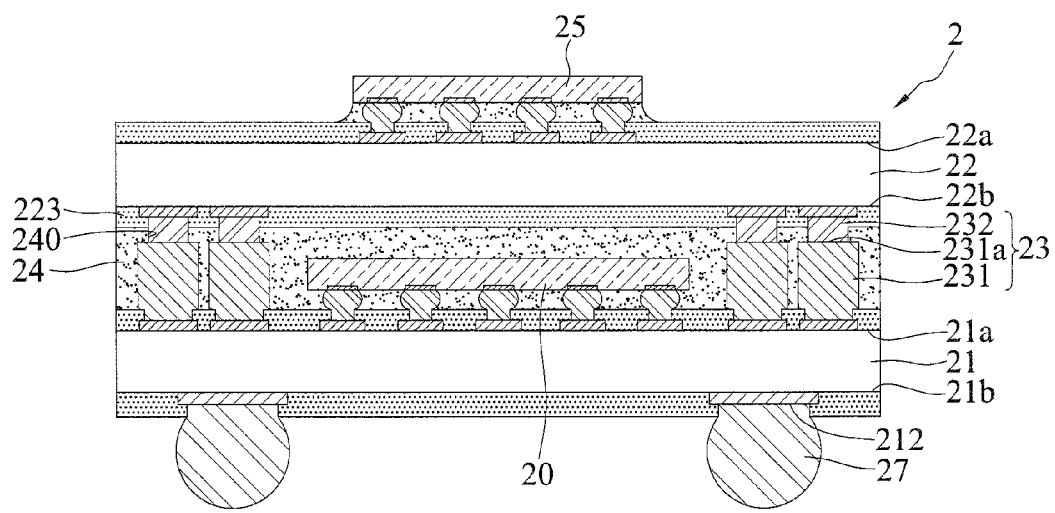

Referring to FIG. 2D, the second packaging substrate 22 is stacked on the first packaging substrate 21 via the fourth surface 22b thereof, with the second support portions 232 positioned in the openings 240 of the encapsulant 24 and bonded with the top surfaces 231a of the first support portions 231.

In the present embodiment, the first support portions 231 and the second support portions 232 constitute support members 23 and the encapsulant 24 abuts against the insulating layer 223 on the fourth surface 22b of the second packaging substrate 22.

Further, a plurality of solder balls 27 are formed on the third conductive pads 212 of the second surface 21b of the first packaging substrate 21.

In another embodiment, if the process is continued from FIG. 2B', a stack structure 2' as shown FIG. 2D' is formed. In a further embodiment, referring to FIG. 2D", a gap t is formed between the encapsulant 24 and the second packaging substrate 22.

Figure 3A:
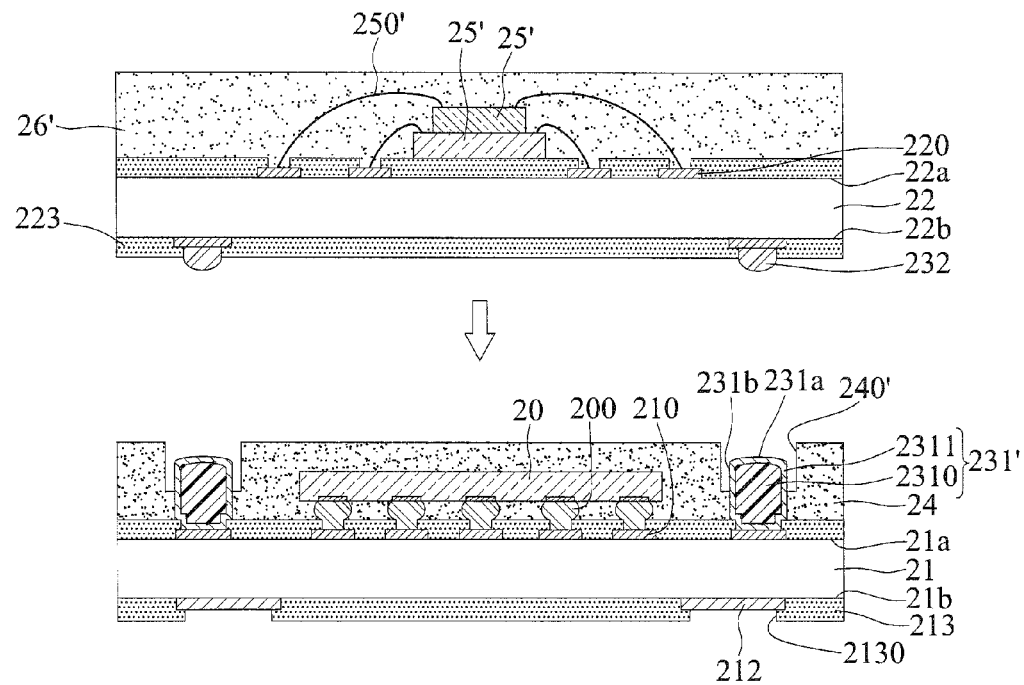
FIGS. 3A and 3B are schematic cross-sectional views showing a method for fabricating a PoP structure according to another embodiment of the present invention.
Figure 3B:
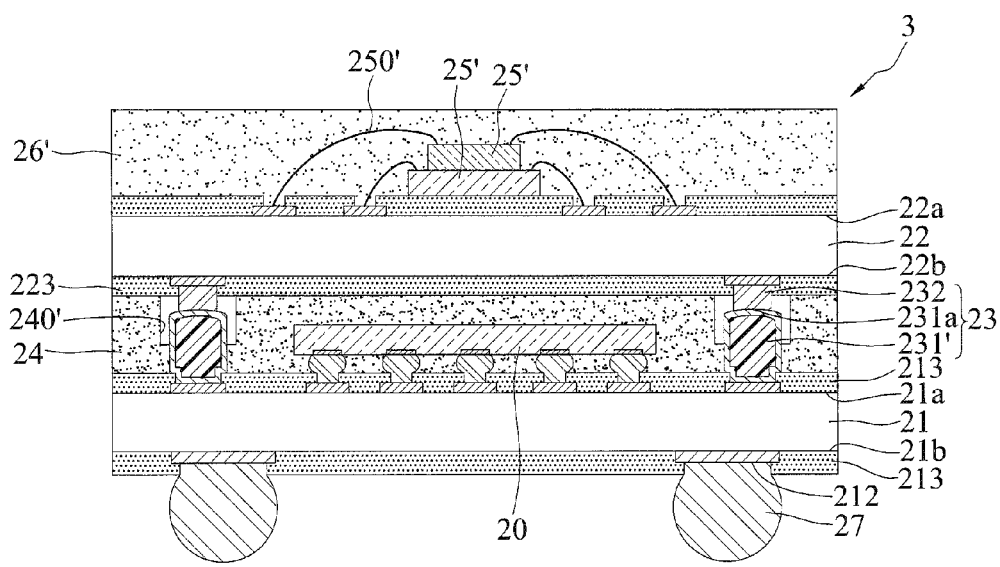

Further, referring to FIGS. 3A and 3B, a wire-bonding package can be formed on the second packaging substrate 22. In particular, a plurality of second electronic element 25' are disposed on the second packaging substrate 22 and electrically connected to the fourth conductive pads 220 through a plurality of bonding wires 250', and an encapsulant 26' is formed on the second packaging substrate 22 for encapsulating the second electronic elements 25' and the bonding wires 250'.

In the present embodiment, the second electronic elements 25' are stacked on one another to form a stack structure. The first support portions 231' are ball-shaped or post-shaped copper bumps 2310 covered with a solder material 2311. For example, the entire surface of each of the copper bumps 2310 is covered by the solder material 2311, and the side surface 231b of each of the first support portions 231' is partially exposed from the corresponding opening 240'.

According to the present invention, an encapsulant 24 is formed first to encapsulate the first support portions 231, 231' and then a plurality of openings 240, 240' are formed in the encapsulant 24 for exposing at least portions of the top surfaces 231a of the first support portions 231, 231'. As such, when the second support portions 232 are bonded with the first support portions 231, 231' in a subsequent process, the encapsulant 24 effectively separates the support members 23 from one another so as to prevent bridging from occurring therebetween, thereby improving the product yield and reliability.

The present invention further provides a PoP stack structure 2, 2', 2", 3, which has: a first packaging substrate 21 having a first surface 21a and a second surface 21b opposite to the first surface 21a; a first electronic element 20 disposed on the first surface 21a of the first packaging substrate 21 and electrically connected to the first packaging substrate 21; a plurality of first support portions 231, 231' formed on the first surface 21a of the first packaging substrate 21; an encapsulant 24 formed on the first surface 21a of the first packaging substrate 21 for encapsulating the first electronic element 20 and the first support portions 231, 231' and having a plurality of openings 240, 240' for exposing portions of surfaces of the first support portions 231; and a second packaging substrate 22 having a plurality of second support portions 232 and stacked on the first packaging substrate 21 with the second support portions 232 positioned in the openings 240 of the encapsulant 24 and bonded with the first support portions 231, 231'.

In the present embodiment, the first support portions 231, 231' and the second support portions 232 are metal posts and made of copper or a solder material.

In the present embodiment, the first support portions 231, 231' are electrically connected to the first packaging substrate 21, and the second support portions 232 are electrically connected to the second packaging substrate 22.

The PoP structure 2, 2', 2", 3 can further have at least a second electronic element 25, 25' disposed on and electrically connected to the second packaging substrate 22.

The encapsulant 24 can abut against the second packaging substrate 22, or a gap t can be formed between the encapsulant 24 and the second packaging substrate 22.

According to the present invention, an encapsulant is formed first to encapsulate the first support portions and then a plurality of openings are formed in the encapsulant for exposing the first support portions. As such, when the second support portions are bonded with the first support portions in a subsequent process, the encapsulant effectively separates the support members from one another so as to prevent bridging from occurring therebetween, thereby improving the product yield and reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package on package (PoP) structure, comprising:
a first packaging substrate;
at least a first electronic element disposed on and electrically connected to the first packaging substrate;
a plurality of first support portions formed on the first packaging substrate, wherein the first support portions are copper bumps with all side surfaces covered completely with a solder material;
an encapsulant formed on the first packaging substrate for encapsulating the first electronic element and the first support portions, the encapsulant having a plurality of openings for exposing top surfaces of the first support portions and being free from exposing side surfaces of the first support portions;
a second packaging substrate having a plurality of second support portions and stacked on the first packaging substrate with the second support portions positioned in the openings of the encapsulant and bonded with the top surfaces of the first support portions, wherein at least a portion of the second support portion is free from directly contacting the encapsulant; and
an insulating layer formed on the second packaging substrate and encapsulating a portion of the second support portions, wherein an air gap is formed between the encapsulant and the insulating layer for the encapsulant to be free from directly contacting the insulating layer.

2. The structure of claim 1, wherein the first support portions are electrically connected to the first packaging substrate.

3. The structure of claim 1, wherein the first support portions are metal posts.

4. The structure of claim 1, wherein the copper bumps are of a ball shape or a post shape.

5. The structure of claim 1, wherein the second support portions are electrically connected to the second packaging substrate.

6. The structure of claim 1, wherein the second support portions are metal posts.

7. The structure of claim 1, wherein the second support portions are made of copper or a solder material.

8. The structure of claim 1, further comprising at least a second electronic element disposed on the second packaging substrate.

* * * * *